(12) United States Patent
Yang et al.

(10) Patent No.: US 12,207,567 B2
(45) Date of Patent: Jan. 21, 2025

(54) UNDER-CUT VIA ELECTRODE FOR SUB 60NM ETCHLESS MRAM DEVICES BY DECOUPLING THE VIA ETCH PROCESS

(71) Applicant: Taiwan Semiconductor Manufacturing Company, Ltd., Hsin-Chu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/360,055

(22) Filed: Jul. 27, 2023

(65) Prior Publication Data

US 2023/0371399 A1 Nov. 16, 2023

Related U.S. Application Data

(60) Continuation of application No. 17/335,817, filed on Jun. 1, 2021, now Pat. No. 11,785,863, which is a continuation of application No. 16/728,043, filed on Dec. 27, 2019, now Pat. No. 11,024,797, which is a division of application No. 16/008,650, filed on Jun. 14, 2018, now Pat. No. 10,522,741.

(51) Int. Cl.
| | |
|---|---|
| *H10N 50/80* | (2023.01) |
| *H10B 61/00* | (2023.01) |
| *H10N 50/01* | (2023.01) |
| *H10N 50/85* | (2023.01) |
| *B82Y 25/00* | (2011.01) |

(52) U.S. Cl.
CPC .............. *H10N 50/80* (2023.02); *H10B 61/00* (2023.02); *H10N 50/01* (2023.02); *H10N 50/85* (2023.02); *B82Y 25/00* (2013.01)

(58) Field of Classification Search
CPC ........ H10N 50/80; H10N 50/01; H10N 50/85; H10B 61/00; H01L 43/02; H01L 43/08; H01L 43/10; H01L 43/12; H01L 27/222; B82Y 25/00
USPC ......................................................... 257/421
See application file for complete search history.

(56) References Cited

U.S. PATENT DOCUMENTS

| | | | |
|---|---|---|---|
| 8,785,907 | B2 | 7/2014 | Goel et al. |
| 9,224,785 | B2 | 12/2015 | Do et al. |
| 9,773,978 | B1 | 9/2017 | Fraczak et al. |
| 10,069,064 | B1 | 9/2018 | Haq et al. |

(Continued)

*Primary Examiner* — Tu-Tu V Ho
(74) *Attorney, Agent, or Firm* — HAYNES AND BOONE, LLP

(57) ABSTRACT

A method for fabricating a magnetic tunneling junction (MTJ) structure is described. A first dielectric layer is deposited on a bottom electrode and partially etched through to form a first via opening having straight sidewalls, then etched all the way through to the bottom electrode to form a second via opening having tapered sidewalls. A metal layer is deposited in the second via opening and planarized to the level of the first dielectric layer. The remaining first dielectric layer is removed leaving an electrode plug on the bottom electrode. MTJ stacks are deposited on the electrode plug and on the bottom electrode wherein the MTJ stacks are discontinuous. A second dielectric layer is deposited over the MTJ stacks and polished to expose a top surface of the MTJ stack on the electrode plug. A top electrode layer is deposited to complete the MTJ structure.

20 Claims, 2 Drawing Sheets

(56) References Cited

U.S. PATENT DOCUMENTS

| | | |
|---|---|---|
| 10,522,741 B1 | 12/2019 | Yang et al. |
| 11,024,797 B2 | 6/2021 | Yang et al. |
| 2016/0079518 A1 | 3/2016 | Pi et al. |
| 2017/0110649 A1 | 4/2017 | Diaz et al. |
| 2019/0096461 A1 | 3/2019 | Koike et al. |
| 2019/0386201 A1 | 12/2019 | Yang et al. |
| 2020/0136021 A1 | 4/2020 | Yang et al. |

UNDER-CUT VIA ELECTRODE FOR SUB 60NM ETCHLESS MRAM DEVICES BY DECOUPLING THE VIA ETCH PROCESS

PRIORITY DATA

The present application is a continuation application of U.S. patent application Ser. No. 17/335,817, filed Jun. 1, 2021, which is a continuation application of U.S. patent application Ser. No. 16/728,043, filed Dec. 27, 2019, which is a divisional application of U.S. patent application Ser. No. 16/008,650, filed Jun. 14, 2018, each of which is herein incorporated by reference in its entirety.

TECHNICAL FIELD

This application relates to the general field of magnetic tunneling junctions (MTJ) and, more particularly, to etchless methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define those millions of MTJ cells in each MRAM device and make them non-interacting to each other, precise patterning steps including reactive ion etching (RIE) are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance.

To solve this issue, pure physical etching techniques such as ion beam etching (IBE) have been applied to etch the MTJ stack to avoid the damaged MTJ sidewall.

However, due to their non-volatile nature, IBE etched conductive materials in MTJ and the bottom electrode can be re-deposited into the tunnel barrier, resulting in shorted devices. A new device structure and associated process flow which can form MTJ patterns with desired sizes without plasma etch is desired.

Several patents teach methods of forming an MTJ without etching, including U.S. Pat. No. 9,773,978 (Fraczak et al) and U.S. Patent Application 2017/0110649 (Diaz et al), but these methods are different from the present disclosure.

SUMMARY

It is an object of the present disclosure to provide a method of forming MTJ structures without chemical damage or re-deposition of metal materials on the MTJ sidewalls.

Another object of the present disclosure is to provide a method of electrically isolatedly forming MTJ patterns on top of the bottom electrode without etching.

Another object of the present disclosure is to provide an undercut via bottom electrode and electrically isolatedly forming MTJ patterns on top of the bottom electrode without etching.

In accordance with the objectives of the present disclosure, a method for fabricating a magnetic tunneling junction (MTJ) structure is achieved. A first dielectric layer is deposited on a bottom electrode. The first dielectric layer is partially etched through to form a first via opening having straight sidewalls. Then, the first dielectric layer is etched all the way through to the bottom electrode in the first via opening to form a second via opening wherein the second via opening has tapered sidewalls wherein a top width of the second via opening is smaller than a bottom width of the second via opening. A metal layer is deposited over the first dielectric layer and in the second via opening and thereafter the metal layer overlying the first dielectric layer is removed. The remaining first dielectric layer is removed wherein the metal-filled second via opening forms an electrode plug on the bottom electrode. MTJ stacks are deposited on the electrode plug and on the bottom electrode wherein the MTJ stacks are discontinuous. A second dielectric layer is deposited over the MTJ stacks and polished to expose a top surface of the MTJ stack on the electrode plug. A top electrode layer is deposited on the second dielectric layer and contacting the top surface of the MTJ stack on the electrode plug to complete the MTJ structure.

Also in accordance with the objects of the present disclosure, an improved magnetic tunneling junction (MTJ) is achieved. The MTJ structure comprises a sub-60 nm MTJ device on an electrode plug, a bottom electrode underlying the electrode plug, and a top electrode overlying and contacting the MTJ stack.

BRIEF DESCRIPTION OF THE DRAWINGS

In the accompanying drawings forming a material part of this description, there is shown.

DETAILED DESCRIPTION

In the present disclosure, it is demonstrated that by decoupling the etch process, we can create a tapered dielectric via profile with a tunable sidewall angle. After later metal deposition and chemical mechanical polishing (CMP), an undercut via electrode can be formed. Assisted by high angle IBE or RI E trimming, the via's top and bottom sizes can decrease to sub 60 nm and 30 nm, respectively. After MTJ deposition, the same size of 60 nm MTJ patterns can be electrically isolatedly formed on top of the bottom electrode, without using a plasma or a physical etch. Consequently, chemical damage and/or conductive metal re-deposition on the MTJ sidewall are avoided, improving the MRAM device performance.

In a typical MTJ process, the MTJ stack is deposited onto a uniform sized bottom electrode. Plasma etch is used to transfer the photolithography created photoresist pattern into the MTJ stack. Physical etch induced metal re-deposition and/or chemical etch induced sidewall chemical damage cannot be avoided in this process. However, in the process of the present disclosure, the MTJ stack is deposited onto the undercut via electrode, so that the patterns are formed without etching, thus avoiding these issues.

Figure 1:
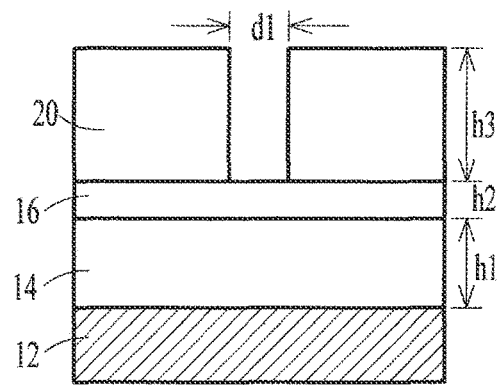
FIGS. 1 through 8 illustrate in cross-sectional representation steps in a preferred embodiment of the present disclosure.

The preferred embodiment of the present disclosure will be described in more detail with reference to FIGS. 1-8. FIG. 1 illustrates a bottom electrode layer 12 formed on a semiconductor substrate, not shown. First, on top of bottom electrode or circuit 12, a dielectric layer 14 such as SiO2, SiN, SiON, SiC, SiCN or carbon is deposited using chemical vapor deposition (CVD) or spin-coating to a thickness h1 of 0.100 nm.

A bottom anti-reflective coating (BARC) 16 that may be a cross-linked polymer or a dielectric anti-reflective coating (DARC) such as SiON with thickness h2 of 30-100 nm is deposited on the dielectric layer 14. Next, a photoresist is spin-coated and patterned by photolithography, forming via photoresist patterns 20 with size d1 of approximately 70-80 nm and height h3 of 200 nm.

Figure 2:
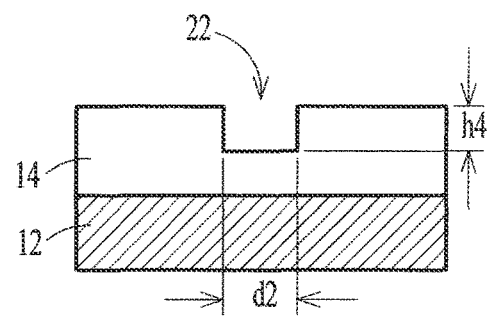

Next, referring to FIG. 2, the anti-reflective coating 16 is completely etched and the dielectric layer 14 is partially etched through using the photoresist pattern by a fluorine carbon-based plasma such as CF4 or CHF3 alone, or mixed with Ar and N2. The layers can also be patterned by a physical etch such as IBE. The partially etched part of the dielectric 14 has a straight profile as defined by the photoresist. The width of the via 22 partially etched into the dielectric layer 14 is d2, about 60-70 nm. The height of the dielectric 14 etched into is h4, about 10 to 90% of the total height h1.

Figure 3:
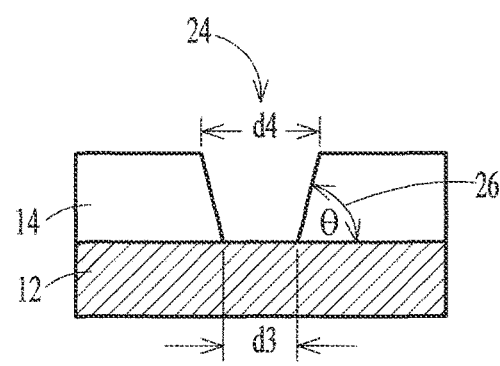

The photoresist 20 and remaining BARC 16 are stripped away by oxygen alone or mixed with N2 or H2O. Referring now to FIG. 3, the remaining dielectric layer 14 is etched by the previously partially patterned part above as a hard mask. Since the photoresist is gone, the dielectric is etched from all directions. Here it is noted that the less the first step of etch time, i.e., the more the second step of etch time, the larger the taper angle will be. For instance, if 50% of the dielectric is etched during the first etch step and the remaining 50% is etched during the second etch step, the resulting top to bottom critical dimension (CD) ratio is about 1.6 with a tapered angle of approximately 45°. The tapered via 24 will have a bottom width d3 of about 40-50 nm and a top width d4 of about 60-80 nm. The taper angle 26 is preferably between about 10 and 80°.

Figure 4:
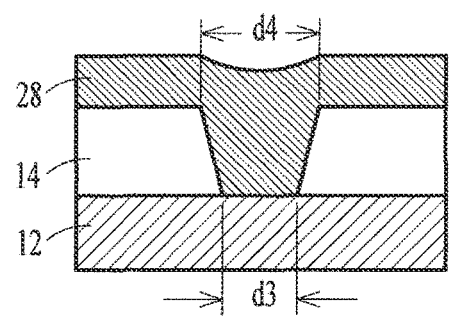

After etching, as shown in FIG. 4, metal 28 such as Ta, TaN, Ti, TiN, W, Cu, Mg, Ru, Cr, Co, Fe, Ni or their alloys is deposited into the vias 24 with a thickness of 70 nm, as assisted by the dielectric's tapered profile. For example, via 24 may have a top and bottom CD of d4=80 and d3=50 nm, respectively.

Figure 5:
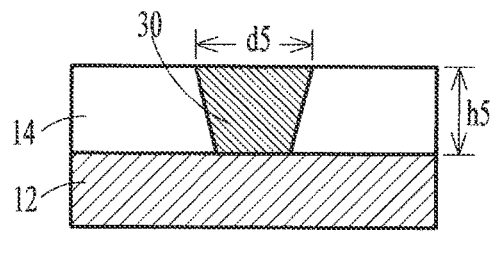

As illustrated in FIG. 5, CMP is then applied to remove the extra metal on the surface and optionally over polish away some dielectric underneath, with remaining dielectric thickness h5 of >50 nm.

Figure 6:
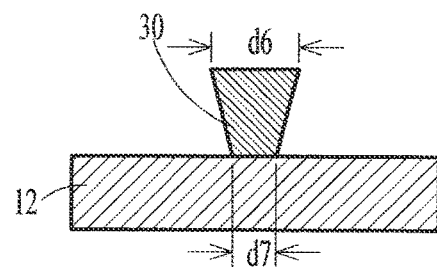

Now, as shown in FIG. 6, the dielectric 14 is stripped off using plasma to expose the entire undercut via 30. Fluorine carbon with low F/C ratio such as C4F8 can be used to strip off dielectric 14 comprising SiO2 or SiON, CH2F2 can be used to strip off SiN and SiCN, and 02 can be used to strip off spin-on or amorphous carbon. These gas species together with low bias power (≤100 W) and high source power (200 W) ensure that the electrode 30 can stay the same or only shrink by 55 nm after stripping. If a sub 60 nm MTJ is desired, one can use high angle IBE trimming to proportionally decrease the via electrode's top and bottom size, using a high angle of between about 60 and 80°. Another way to achieve a small size electrode 30 is to use a high F/C ratio fluorine carbon such as CF4 plasma with high source ((200 W) and low bias (≤100 W) power during the dielectric stripping. This condition provides a moderate etch rate (50-100 nm/min) on metals like Ta, Ti, TaN and TiN, so that with proper over etch, the via electrode's top d6 and bottom d7 size can be trimmed to sub 60 nm and sub 40 nm or sub 30 nm, respectively, maintaining the undercut profile. For either method, ex-situ trimming is used when the metal vias are made of inert metals and in-situ trimming is needed for metals that can be readily oxidized in air.

Figure 7:
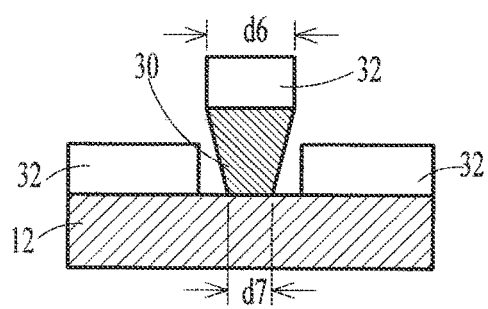

Now, as shown in FIG. 7, MTJ film layers are deposited, typically including a seed layer, a pinned layer, a barrier layer, a free layer, and a cap layer, for example. These layers form the MTJ film stack 32. The MTJ stack 32 can be deposited ex-situ, but preferably, the MTJ stack is deposited in-situ. After the MTJ stack is deposited, it only covers the top of the undercut metal via 30 as well as the original bottom electrode 12 on the sides. It should be noted that the MTJ stack is discontinuous because of the undercut structure 30.

Figure 8:
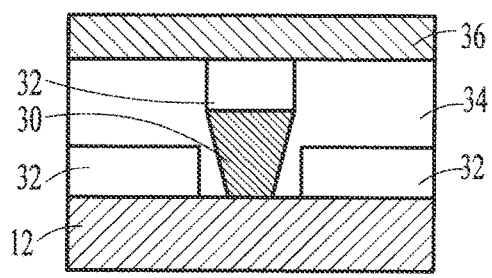

As a result, the MTJ patterns with size d6 (50-60 nm) are formed without etching and thus, without plasma etch-induced chemical damage and/or conductive metal re-deposition on the MTJ sidewalls. Now, as shown in FIG. 8, dielectric layer 34 is deposited and flattened by CMP, for example, wherein the top MTJ surface is exposed. Finally, the top metal electrode 36 is deposited to form the whole device, also preferably in an in-situ method.

In the process of the present disclosure, by decoupling the etch process, we can create a dielectric via with tapered profile which leads to an undercut via electrode to allow for etchless MTJ patterns. This approach avoids any chemical damage and/or conductive metal re-deposition on the MTJ sidewall, thus improving the MRAM device performance.

In the present disclosure, we form sub 60 nm MTJ patterns by depositing MTJ stacks onto the undercut via electrodes, without using plasma to etch them directly. More specifically, the dielectric is partially etched first, forming shallow vias with straight profile. Then the photoresist is stripped off and the second step of etch is continued. During the second step, the first step formed patterns' top corners shrink horizontally, eventually forming vias with a tapered angle after the process is done. Moreover, the less the first step of etch time, i.e., the more the second step of etch time is needed, the larger the taper angle. Therefore the dielectric vias' profile can be precisely controlled by distributing these two steps' etch time. After later metal deposition and CMP, an undercut via electrode is formed, making the etchless MRAM devices possible.

The process of the present disclosure will be used for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
    forming a dielectric layer on a first electrode;
    forming a tapered via opening through the dielectric layer to expose the first electrode;
    depositing a conductive material into the tapered via opening to form a conductive via;
    selectively removing the dielectric layer to expose the first electrode; and
    depositing a stack of magnetic tunneling junction (MTJ) layers on the conductive via and the first electrode such that the conductive via causes the stack of MTJ layers to be separated into a first portion and a second portion via the deposition of the stack of MTJ layers, wherein the first portion of the stack of MTJ layers is disposed directly on the conductive via and the second portion of the stack of MTJ layers is disposed directly on the first electrode such that the first portion of the stack of the MTJ layers is discontinuous with respect to the second portion of the stack of the MTJ layers after the depositing of the stack of MTJ layers.

2. The method of claim 1, further comprising forming a dielectric layer on the first and second portions of the stack of MTJ layers.

3. The method of claim 2, wherein the forming of the dielectric layer on the first and second portions of the stack of MTJ layers includes forming the dielectric layer directly on the first and second portions of the stack of MTJ layers and the conductive via.

4. The method of claim 2, further comprising forming a second electrode on the dielectric layer and the first portion of the stack of MTJ layers such that the second electrode is electrically coupled to the first portion of the stack of MTJ layers.

5. The method of claim 1, wherein the conductive via has a tapered cross-sectional shape.

6. The method of claim 1, wherein the forming of the tapered via opening includes:
   forming a patterned resist layer over the dielectric layer on the first electrode;
   with the patterned resist layer as an etch mask etching the dielectric layer to form a via opening that partially extends into the dielectric layer;
   removing the patterned photoresist layer; and
   after the removing of the patterned photoresist layer, etching the via opening to form the taper via opening.

7. The method of claim 1,
   wherein the tapered via comprises a bottom width adjacent the first electrode and a top width away from the first electrode,
   wherein the top width is greater than the bottom width.

8. The method of claim 1, wherein the depositing of the stack of MTJ on the conductive via and the first electrode includes depositing one or more of a seed layer, a pinned layer, a barrier layer, a free layer, and a cap layer.

9. A method comprising:
   forming a first dielectric layer on a first electrode;
   forming a trench through the first dielectric layer to expose a portion of the first electrode;
   forming a conductive via in the trench;
   removing the first dielectric layer to expose a sidewall of the conductive via; and
   after the removing of the first dielectric layer to expose the sidewall portion of the conductive via, depositing a stack of magnetic tunneling junction (MTJ) layers on the conductive via and the first electrode such that the conductive via causes the stack of MTJ layers to be separated into a first portion and a second portion via the deposition of the stack of MTJ layers, the first portion of the stack of the MTJ layers is discontinuous with respect to the second portion of the stack of the MTJ layers after the depositing of the stack of MTJ layers.

10. The method of claim 9, wherein the first portion of the stack of MTJ layers is disposed directly on the conductive via and the second portion of the stack of MTJ layers is disposed directly on the first electrode after the depositing of the stack of MTJ layers.

11. The method of claim 9, wherein the first portion of the stack of MTJ layers extends to a first height above the first electrode after the depositing of the stack of MTJ layers, and wherein the second portion of the stack of MTJ layers extends to a second height above the first electrode after the depositing of the stack of MTJ layers, the second height being different than the first height.

12. The method of claim 9, further comprising forming a second electrode directly on the first portion of the stack of MTJ layers without forming the second electrode directly on the second of the stack of MTJ layers.

13. The method of claim 9, further comprising performing a planarization process on the conductive via and the first dielectric layer prior to the removing of the first dielectric layer to expose the sidewall of the conductive via.

14. The method of claim 9, wherein the forming of the trench through the first dielectric layer to expose the first electrode includes:
   performing a first removal process to remove a first portion of the first dielectric layer, wherein the portion of the first electrode is still covered by a second portion of the first dielectric layer after the performing of the first removal process; and
   performing a second removal process to remove the second portion of the first dielectric layer to expose the portion of the first electrode.

15. The method of claim 14, wherein the first removal process includes using a fluorine carbon-based plasma.

16. The method of claim 14, wherein the first removal process includes using an ion beam etching process.

17. A method comprising:
   providing a conductive via embedded in a first dielectric layer and disposed on a first electrode;
   removing the first dielectric layer to expose a first portion of the conductive via; and
   after the removing of the first dielectric layer to expose the first portion of the conductive via, depositing a stack of magnetic tunneling junction (MTJ) layers on the conductive via and the first electrode such that the conductive via causes the stack of MTJ layers to be separated into a first portion and a second portion via the deposition of the stack of MTJ layers, the first portion of the stack of the MTJ layers is discontinuous with respect to the second portion of the stack of the MTJ layers after the depositing of the stack of MTJ layers.

18. The method of claim 17, wherein the first portion of the stack of MTJ layers is disposed directly on a top surface of the conductive via and the second portion of the stack of MTJ layers is disposed directly on the first electrode after the depositing of the stack of MTJ layers.

19. The method of claim 18, wherein the first portion of the stack of MTJ layers has a first width,
   wherein the top surface of the conductive via has a second width that is the same as the first width, and
   wherein a bottom surface of the conductive via has a third width that is less than the second width.

20. The method of claim 17, wherein the depositing of the stack of MTJ layers on the conductive via and the first electrode includes depositing a seed layer, a pinned layer, a barrier layer, a free layer, and a cap layer.

* * * * *